(12) United States Patent
Shiraki et al.

(10) Patent No.: US 6,797,453 B2
(45) Date of Patent: Sep. 28, 2004

(54) RADIATION SENSITIVE COMPOSITION FOR FORMING AN INSULATING FILM, INSULATING FILM AND DISPLAY DEVICE

(75) Inventors: Shinji Shiraki, Tokyo (JP); Masayoshi Suzuki, Tokyo (JP); Hirofumi Sasaki, Tokyo (JP); Kazuaki Niwa, Tokyo (JP); Michinori Nishikawa, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/349,080

(22) Filed: Jan. 23, 2003

(65) Prior Publication Data

US 2003/0215737 A1 Nov. 20, 2003

(30) Foreign Application Priority Data

| Jan. 24, 2002 | (JP) | 2002-014998 |
| Sep. 20, 2002 | (JP) | 2002-274809 |
| Oct. 31, 2002 | (JP) | 2002-317124 |

(51) Int. Cl.$^7$ .................................... G03F 7/075
(52) U.S. Cl. .................................... 430/270.1
(58) Field of Search ...................... 430/270.1

(56) References Cited

U.S. PATENT DOCUMENTS

| 5,385,955 A | 1/1995 | Tarshiani et al. ............ 522/31 |
| 5,627,010 A | 5/1997 | Pai et al. ................ 430/270.1 |
| 5,731,126 A | 3/1998 | Takemura et al. ....... 430/270.1 |
| 5,777,038 A * | 7/1998 | Nishikawa et al. ......... 525/295 |
| 6,060,130 A * | 5/2000 | Kim ........................... 427/558 |
| 6,087,064 A | 7/2000 | Lin et al. ................ 430/270.1 |
| 6,270,941 B1 | 8/2001 | Yasunami ............... 430/270.1 |
| 6,296,985 B1 | 10/2001 | Mizutani et al. ........ 430/270.1 |
| 6,309,796 B1 | 10/2001 | Nakashima et al. ..... 430/287.1 |
| 6,340,734 B1 | 1/2002 | Lin et al. ...................... 528/15 |
| 6,344,305 B1 | 2/2002 | Lin et al. ................ 430/270.1 |
| 2001/0012596 A1 | 8/2001 | Kunimoto et al. .......... 430/138 |

FOREIGN PATENT DOCUMENTS

| EP | 0 725 106 | 8/1996 |
| EP | 0 965 618 | 12/1999 |
| EP | 1 150 165 | 10/2001 |
| EP | 1 235 104 | 8/2002 |
| EP | 1 296 540 | 3/2003 |
| JP | 04-330444 | 11/1992 |
| JP | 07-098502 | 4/1995 |
| JP | 07-098503 | 4/1995 |
| JP | 07-140648 | 6/1995 |
| JP | 10-153854 | 6/1998 |
| JP | 3003064 | 1/2000 |
| JP | 2000-298352 | 10/2000 |
| JP | 2001-281853 | 10/2001 |
| JP | 2001-281861 | 10/2001 |
| WO | WO 02/090423 | 11/2002 |

OTHER PUBLICATIONS

Derwent Abstracts, AN 2002–182008, XP–002260376, JP 2001–300951, Oct. 30, 2001.
Patent Abstracts of Japan, JP 2001–288364, Oct. 16, 2001.
Patent Abstracts of Japan, JP 2000–302869, Oct. 31, 2000.

* cited by examiner

*Primary Examiner*—Hoa Van Le
(74) *Attorney, Agent, or Firm*—Oblon, Spivak, McClelland, Maier & Neustadt, P.C.

(57) ABSTRACT

There is disclosed a radiation sensitive composition containing a silane compound represented by the following formula (1):

$$(R^1)_p Si(X)_{4-p} \qquad (1)$$

wherein $R^1$ is an unhydrolyzable organic group having 1 to 12 carbon atoms, X is a hydrolyzable group, and p is an integer of 0 to 3, a hydrolyzate thereof and a condensate of the hydrolyzate; and a compound which generates an acid or base upon exposure to radiation. The composition is used to form an insulating film for an organic EL display device, and an interlayer insulating film for a liquid crystal display device.

13 Claims, No Drawings

RADIATION SENSITIVE COMPOSITION FOR FORMING AN INSULATING FILM, INSULATING FILM AND DISPLAY DEVICE

FIELD OF THE INVENTION

The present invention relates to a radiation sensitive composition for forming an insulating film, an insulating film and a display device. More specifically, it relates to a negative type radiation sensitive composition suitable for the formation of an insulating film using radiation such as ultraviolet rays, deep ultraviolet rays, X-radiation, electron beam, molecular beam, γ-ray, synchrotron radiation or proton beam, an insulating film for a display device formed therefrom, and a display device having the insulating film.

DESCRIPTION OF THE PRIOR ART

An organic EL display device has small dependence on view angle as it emits light by itself and has various advantages such as excellent impact resistance, low voltage drive, low power consumption and high operation stability at a low temperature range as it is a solid device, in comparison with a liquid crystal display device. Since it is highly expected that the organic EL display device will be used particularly for mobile applications such as portable terminals and automobiles due to the above advantages, studies on the organic EL display device are under way energetically.

The production of such an organic EL display device is generally carried out by the following method. A transparent electrode (hole injection electrode) pattern such as a tin-doped indium oxide (ITO) pattern and a hole transport layer pattern are formed on a substrate. Then, an insulating film pattern and a cathode rib pattern are formed, followed by the patterning of an organic EL layer, an electron transport layer and a cathode by deposition in the case of a passive type organic EL display device. In the case of an active type organic EL display device, after an ITO pattern and an insulating film pattern which will become organic EL layer ribs are formed, an organic EL layer pattern is formed by a masking method or ink jet method, followed by the formation of an electron transport layer and a cathode (electron injection electrode).

In general, the organic EL layer is made from a base material such as $Alq_3$ or $BeBq_3$ doped with quinacridone or coumarine and the cathode is mainly made from a material essentially composed of a metal having a low work function such as Mg or Ag.

To meet recent demand for high resolution, an organic EL display device having a larger numerical aperture is now under study.

However, there is definite limitation to the improvement of the numerical aperture for the following reasons.

That is, to improve the numerical aperture of a passive type organic EL display device, the pattern widths of an insulating film and a cathode rib pattern need to be reduced. This requires a certain degree of strength and there is a limitation to the reduction of pattern width from the viewpoint of resolution. Accordingly, a sufficiently large numerical aperture could not be obtained.

In an active type organic EL display device, to prevent a short circuit in an ITO pattern for each pixel, a certain space must be formed between pixels, thereby limiting the numerical aperture.

An active type organic EL display device having a structure capable of obtaining a larger numerical aperture is now under study.

This active type organic EL display device is produced by the following method, for example.

A drive terminal is formed on a glass substrate or the like, a first insulating film is formed as a flattening film on the terminal, and then a transparent electrode (hole injection electrode) pattern such as an ITO pattern is formed on the first insulating film. The formation of these patterns is generally carried out by a wet etching method.

A hole transport layer pattern is further formed on the transparent electrode pattern by a masking method. Thereafter, an ITO pattern, a second insulating film pattern which will become ribs for an organic EL layer and an organic EL layer pattern are formed by a masking method or ink jet method, followed by the formation of an electron transport layer and a cathode (electron injection electrode).

At this point, a 1 to 15 μm long through hole or U-shaped depression must be formed in the first insulating film to make the ITO electrode (hole injection electrode) and the drive terminal conductive with each other.

It is known that an organic EL light emissive layer deteriorates quickly and its light emission is impeded when it contacts water even if it is a low-molecular weight light emitting layer or polymer light emitting layer. It is considered that water comes from environment or a trace amount of water adsorbed to an insulating film material permeates an organic EL layer little by little.

Heretofore, there has not been proposed a material capable of forming an insulating film which has resolution high enough to form a through hole or U-shaped depression for realizing a larger numerical aperture, excellent flattening capability and high resistance to a resist remover used for the formation of a transparent electrode and further prevents the permeation of impurities (mainly water) which impede light emission.

A thin film transistor (to be abbreviated as TFT hereinafter) liquid crystal display device is generally produced by opposing a TFT array substrate having TFT's, electrode lines and capacitors formed on a glass substrate to a color filter substrate having a color filter formed on another glass substrate, joining them together using a sealer, injecting liquid crystals into the space between the substrates and sealing up the injection port with a sealer.

The above TFT array substrate is generally produced as follows. TFT elements, display electrodes, scanning lines (gate electrodes), signal lines (drain electrodes) and capacitors are first formed on a glass substrate. Thereafter, an interlayer insulating film is formed on these, a contact hole pattern for interconnecting pixel electrodes and source electrodes is formed, and then transparent pixel electrodes (ITO) are formed on the interlayer insulating film. Thereafter, the transparent pixel electrodes are partitioned for each pixel by etching, and a liquid crystal alignment film is formed and rubbed.

When an end portion of each pixel electrode is placed upon an end portion of a scanning line or signal line to increase the numerical aperture as much as possible, the above interlayer insulating film is formed to insulate them from each other. A radiation sensitive composition from which an interlayer insulating film having a desired pattern shape and excellent flatting capability is obtained from a small number of steps is widely used as a material for the above interlayer insulating film. JP-A 7-98502, JP-A 7-98503 and JP-A 7-140648 (the term "JP-A" as used herein means an "unexamined published Japanese patent application") disclose a combination of a novolak resin or phenolic resin such as polyhydroxystyrene and a quinonediazide-based sensitizer, and Japanese Patent No. 3003064, JP-A 10-153854, JP-A 2001-281853 and JP-A 2001-281861 disclose a combination of an acrylic resin and a quinonediazide-based sensitizer as the materials.

As described above, after such an interlayer insulating film is formed on a substrate, the step of forming a transparent pixel electrode and a liquid crystal alignment film is carried out, and the interlayer insulating film is heated at a high temperature in the above step. Since conventionally known materials for forming an interlayer insulating film are unsatisfactory in terms of heat resistance, they become yellow or brown in the above step with the result of greatly reduced transparency. To avoid this phenomenon, the temperature for heating the transparent electrode film must be set to a certain temperature or lower. If so, the formed transparent electrode film hardly obtains desired electric properties, particularly sufficiently low electric resistance.

After the interlayer insulating film is formed on the substrate, it is supplied to the step of forming an electrode and exposed to organic solvents such as an etchant for the patterning of the electrode and a resist remover. Therefore, the interlayer insulating film needs high solvent resistance so that it is not swollen, deformed or peeled of f from the substrate by these solvents. Further, higher radiation sensitivity and more excellent developability are required from the viewpoint of production yield.

However, there has been unknown a radiation sensitive composition suitable for the formation of an interlayer insulating film for a liquid crystal display device, which has high radiation sensitivity, excellent developability, high heat resistance, high transparency and excellent solvent resistance.

SUMMARY OF THE INVENTION

It is therefore an object of the present invention to provide a radiation sensitive composition for forming an insulating film for an organic EL display device, which has resolution high enough to form a through hole or U-shaped depression, excellent flattening capability and high resistance to a resist remover used to form a transparent electrode, and prevents the permeation of impurities (mainly water) which impede light emission.

It is another object of the present invention to provide a radiation sensitive composition which has high radiation sensitivity, excellent developability, high heat resistance, high transparency and excellent solvent resistance and is suitable for the formation of an interlayer insulating film for a liquid crystal display device.

It is still another object of the present invention to provide an insulating film for an organic EL display device or liquid crystal display device formed from the above composition.

It is a further object of the present invention to provide an organic EL display device or liquid crystal display device having the above insulating film.

Other objects and advantages of the present invention will become apparent from the following description.

According to the present invention, firstly, the above objects and advantages of the present invention are attained by a radiation sensitive composition which comprises:

(A1) at least one compound selected from the group consisting of a silane compound represented by the following formula (1):

wherein $R^1$ is an unhydrolyzable organic group having 1 to 12 carbon atoms, X is a hydrolyzable group, and p is an integer of 0 to 3, a hydrolyzate thereof and a condensate of the hydrolyzate; and (A2) a compound which generates an acid or base upon exposure to radiation, and (B) which is used to form an insulating film for an organic EL display device.

According to the present invention, secondly, the above objects and advantages of the present invention are attained by a radiation sensitive composition which comprises (A1) at least one compound selected from the group consisting of a silane compound represented by the above formula (1), a hydrolyzate thereof and a condensate of the hydrolyzate, and (A2) a compound which generates an acid or base upon exposure to radiation, and (B) which is used to form an interlayer insulating film for a liquid crystal display device.

According to the present invention, thirdly, the above objects and advantages of the present invention are attained by an insulating film for an organic EL display device or a liquid crystal display device, which is formed from the above radiation sensitive composition of the present invention.

According to the present invention, in the fourth place, the above objects and advantages of the present invention are attained by an organic EL display device or liquid crystal display device having the above insulating film.

DETAILED DESCRIPTION OF THE PREFERRED EMBODIMENT

The radiation sensitive composition of the present invention will be described hereinbelow.

Component (A1)

The component (A1) contained in the radiation sensitive composition for forming an insulating film for an organic EL display device and the radiation sensitive composition for forming an insulating film for a liquid crystal display device of the present invention is at least one compound selected from the group consisting of a silane compound represented by the following formula (1), a hydrolyzate thereof and a condensate of the hydrolyzate:

wherein $R^1$ is an unhydrolyzable organic group having 1 to 12 carbon atoms, X is a hydrolyzable group, and p is an integer of 0 to 3.

The hydrolyzable group represented by X is generally a group capable of forming a silanol group when it is hydrolyzed by heating at room temperature (25° C.) to 100° C. without a catalyst in the presence of excess water or a group capable of forming a siloxane bond when it is further condensed. Examples of the-hydrolyzable group include hydrogen atom, halogen atom, alkoxyl group having 1 to 12 carbon atoms, amino group and acyloxyl group having 2 to 12 carbon atoms.

Examples of the unhydrolyzable organic group having 1 to 12 carbon atoms represented by $R^1$ include alkyl group having 1 to 12 carbon atoms, aryl group having 6 to 12 carbon atoms and aralkyl group having 7 to 12 carbon atoms. They may be linear, branched or cyclic and may be existent in combination when a plurality of $R^1$'s are existent in the same molecule.

$R^1$ may contain a structural unit having a hetero atom. Examples of the structural unit include ether, ester and sulfide.

Unhydrolyzability required for $R^1$ means the property of being existent stably under a condition that the hydrolyzable group X is hydrolyzed.

The above p is an integer of 0 to 3, preferably 0 to 2, particularly preferably 1.

The silane compound represented by the above formula (1) is, for example, a saline compound substituted by four hydrolyzable groups, a silane compound substituted by one unhydrolyzable group and three hydrolyzable groups, a silane compound substituted by two unhydrolyzable groups and two hydrolyzable groups, or a silane compound substituted by three unhydrolyzable groups and one hydrolyzable group.

Illustrative examples of these silane compounds include silane compounds substituted by four hydrolyzable groups, such as tetrachlorosilane, tetraminosilane, tetraacetoxysilane, tetramethoxysilane, tetraethoxysilane, tetrabutoxysilane, tetraphenoxysilane, tetrabenziloxysilane and tetrapropoxysilane; silane compounds substituted by one unhydrolyzable group and three hydrolyzable groups, such as methyltrichlorosilane, methyltrimethoxysilane, methyltriethoxysilane, methyltriisopropoxysilane, methyltributoxysilane, ethyltrimethoxysilane, ethyltriethoxysilane, ethyltriisopropoxysilane, ethyltributoxysilane, butyltrimethoxysilane, pentafluorophenyltrimethoxysilane, phenyltrimethoxysilane, phenyltriethoxysilane, d3-methyltrimethoxysilane, nonafluorobutylethyltrimethoxysilane and trifluoromethyltrimethoxysilane; silane compounds substituted by two unhydrolyzable groups and two hydrolyzable groups, such as dimethyldichlorosilane, dimethyldiaminosilane, dimethyldiacetoxysilane, dimethyldimethoxysilane diphenyldimethoxysilane and dibutyldimethoxysilane; and silane compounds substituted by three unhydrolyzable groups and one hydrolyzable group such as trimethylchlorosilane, hexamethyldisilazane, trimethylsilane, tributylsilane, trimethylmethoxysilane and tributylethoxysilane.

Out of these, silane compounds substituted by one unhydrolyzable group and three hydrolyzable groups are preferred, and methyltrimethoxysilane, methyltriethoxysilane, methyltriisopropoxysilane, methyltributoxysilane, phenyltrimethoxysilane, ethyltrimethoxysilane, ethyltriethoxysilane, ethyltriisopropoxysilane, ethyltributoxysilane and butyltrimethoxysilane are particularly preferred.

These silane compounds may be used alone or in combination of two or more.

The component (A1) used in the present invention is at least one compound selected from the group consisting of the above silane compound, a hydrolyzate thereof and a condensate of the hydrolyzate, preferably a hydrolyzate of a silane compound or a condensate of the hydrolyzate.

The conditions for hydrolyzing or condensing the above silane compound are not particularly limited. The hydrolysis or condensation of the silane compound can be carried out by the following step, for example.

The above silane compound and predetermined amounts of water and a suitable solvent are placed in a vessel equipped with a stirrer and stirred in an air atmosphere at a temperature of 0° C. to the boiling point of the solvent or silane compound for 1 to 24 hours. During stirring, the reaction mixture may be concentrated by distillation as required, or the solvent may be newly added.

The solvent used is not limited to a particular kind but generally a solvent identical to a solvent used for the preparation of the radiation sensitive composition which will be described hereinafter. When the solvent is used, its amount is preferably 1,000 parts or less by weight based on 100 parts by weight of the silane compound.

To hydrolyze or condense the above silane compound, a catalyst may be used. The catalyst is a metal chelate compound, organic acid, inorganic acid, organic base or inorganic base.

The metal chelate compound used as the catalyst is preferably a titanium chelate compound, zirconium chelate compound or aluminum chelate compound.

Examples of the metal chelate compound include titanium chelate compounds such as triethoxy•mono (acetylacetonato)titanium, tri-n-propoxy•mono (acetylacetonato)titanium, tri-i-propoxy•mono (acetylacetonato)titanium, tri-n-butoxy•mono (acetylacetonato)titanium, tri-sec-butoxy•mono (acetylacetonato)titanium, tri-t-butoxy•mono (acetylacetonato)titanium, diethoxy•bis(acetylacetonato) titanium, di-n-propoxy•bis(acetylacetonato)titanium, di-i-propoxy•bis(acetylacetonato)titanium, di-n-butoxy•bis (acetylacetonato)titanium, di-sec-butoxy•bis (acetylacetonato)titanium, di-t-butoxy•bis(acetylacetonato) titanium, monoethoxy•tris(acetylacetonato)titanium, mono-n-propoxy•tris(acetylacetonato)titanium, mono-i-propoxy•tris(acetylacetonato)titanium, mono-n-butoxy•tris (acetylacetonato)titanium, mono-sec-butoxy•tris (acetylacetonato)titanium, mono-t-butoxy•tris (acetylacetonato)titanium, tetrakis(acetylacetonato) titanium, triethoxy•mono(ethylacetoacetate)titanium, tri-n-propoxy•mono(ethylacetoacetate)titanium, tri-i-propoxy•mono(ethylacetoacetate)titanium, tri-n-butoxy•mono(ethylacetoacetate)titanium, tri-sec-butoxy•mono(ethylacetonato)titanium, tri-t-butoxy•mono (ethylacetonato)titanium, diethoxy•bis(ethylacetoacetate) titanium, di-n-propoxy•bis(ethylacetoacetate)titanium, di-i-propoxy•bis(ethylacetoacetate)titanium, di-n-butoxy•bis (ethylacetoacetate)titanium, di-sec-butoxy•bis (ethylacetoacetate)titanium, di-t-butoxy•bis (ethylacetoacetate)titanium, monoethoxy•tris (ethylacetoacetate)titanium, mono-n-propoxy•tris (ethylacetoacetate)titanium, mono-i-propoxy•tris (ethylacetoacetate)titanium, mono-n-butoxy•tris (ethylacetoacetate)titanium, mono-sec-butoxy•tris (ethylacetoacetate)titanium, mono-t-butoxy•tris (ethylacetoacetate)titanium, tetrakis(ethylacetoacetate) titanium, mono(acetylacetonato)tris(ethylacetoacetate) titanium, bis(acetylacetonato)bis(ethylacetoacetate)titanium and tris(acetylacetonato)mono(ethylacetoacetate)titanium; zirconium chelate compounds such as triethoxy•mono (acetylacetonato)zirconium, tri-n-propoxy•mono (acetylacetonato)zirconium, tri-i-propoxy•mono (acetylacetonato)zirconium, tri-n-butoxy•mono (acetylacetonato)zirconium, tri-sec-butoxy•mono (acetylacetonato)zirconium, tri-t-butoxy•mono (acetylacetonato)zirconium, diethoxy bis(acetylacetonato) zirconium, di-n-propoxy•bis(acetylacetonato)zirconium, di-i-propoxy•bis(acetylacetonato)zirconium, di-n-butoxy•bis(acetylacetonato)zirconium, di-sec-butoxy•bis (acetylacetonato)zirconium, di-t-butoxy•bis (acetylacetonato)zirconium, monoethoxy tris (acetylacetonato)zirconium, mono-n-propoxy•tris (acetylacetonato)zirconium, mono-i-propoxy•tris (acetylacetonato)zirconium, mono-n-butoxy•tris (acetylacetonato)zirconium, mono-sec-butoxy•tris (acetylacetonato)zirconium, mono-t-butoxy•tris (acetylacetonato)zirconium, tetrakis(acetylacetonato) zirconium, triethoxy•mono(ethylacetoacetate)zirconium, tri-n-propoxy•mono(ethylacetoacetate)zirconium, tri-i-propoxy•mono(ethylacetoacetate)zirconium, tri-n-butoxy•mono(ethylacetoacetate)zirconium, tri-sec-butoxy•mono(ethylacetoacetate)zirconium, tri-t-butoxy•mono(ethylacetoacetate)zirconium, diethoxy•bis (ethylacetoacetate)zirconium, di-n-propoxy•bis (ethylacetoacetate)zirconium, di-i-propoxy•bis (ethylacetoacetate)zirconium, di-n-butoxy•bis (ethylacetoacetate)zirconium, di-sec-butoxy•bis (ethylacetoacetate)zirconium, di-t-butoxy•bis (ethylacetoacetate)zirconium, monoethoxy•tris (ethylacetoacetate)zirconium, mono-n-propoxy•tris (ethylacetoacetate)zirconium, mono-i-propoxy•tris (ethylacetoacetate)zirconium, mono-n-butoxy•tris (ethylacetoacetate)zirconium, mono-sec-butoxy•tris (ethylacetoacetate)zirconium, mono-t-butoxy•tris (ethylacetoacetate)zirconium, tetrakis(ethylacetoacetate) zirconium, mono(acetylacetonato)tris(ethylacetoacetate) zirconium bis(acetylacetonato)bis(ethylacetoacetate) zirconium and tris(acetylacetonato)mono(ethylacetoacetate) zirconium; aluminum chelate compounds such as tris (acetylacetonato)aluminum and tris(ethylacetoacetate) aluminum.

Illustrative examples of the organic acid used as the catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid and tartaric acid.

Illustrative examples of the inorganic acid used as the catalyst include hydrochloric acid, nitric acid, sulfuric acid, hydrofluoric acid and phosphoric acid.

Examples of the organic base used as the catalyst include pyridine, pyrrole, piperazine, pyrrolidine, piperidine, picoline, trimethylamine, triethylamine, monoethanolamine, diethanolamine, dimethyl monoethanolamine, monomethyl diethanolamine, triethanolamine, diazabicyclooctane, diazabicyclononane, diazabicycloundecene and tetramethylammnoium hydroxide.

Examples of the inorganic base used as the catalyst include ammonia, sodium hydroxide, potassium hydroxide, barium hydroxide and calcium hydroxide.

Out of these, metal chelate compounds, organic acids and inorganic acids are preferred, and titanium chelate compounds and organic acids are more preferred as the catalyst.

These compounds may be used alone or in combination of two or more as the catalyst.

The amount of the catalyst is preferably 10 parts or less by weight, more preferably 0.001 to 10 parts by weight, much more preferably 0.01 to 10 parts by weight based on 100 parts by weight of the silane compound.

The weight average molecular weight of the hydrolyzate of the silane compound or the condensate of the hydrolyzate is preferably 15,000 or less, more preferably 500 to 15,000, much more preferably 1,000 to 12,000.

When the weight average molecular weight is within the above range, a composition whose film forming properties and radiation sensitivity are well balanced can be obtained.

It should be understood that the above weight average molecular weight is measured in terms of polystyrene by gel permeation chromatography (may be abbreviated as GPC hereinafter).

(A2) Compound which Generates an Acid or Base upon Exposure to Radiation

The component (A2) used in the present invention is a radiation sensitive acid generator or radiation sensitive base generator.

The radiation sensitive acid generator is a compound which can generate an acidic substance capable of curing (crosslinking) the component (A1) upon exposure to radiation such as ultraviolet radiation. The radiation sensitive acid generator is, for example, a trichloromethyl-s-triazine, diaryliodonium salt, triarylsulfonium salt, quaternary ammonium salt or sulfonic acid ester. Out of these, a diaryliodonium salt and triarylsulfonium salt are preferred.

Examples of the above trichloromethyl-s-triazine include 2,4,6-tris(trichloromethyl)-s-triazine, 2-phenyl-4,6-bis (trichloromethyl)-s-triazine, 2-(4-chlorophenyl)-4,6-bis (trichloromethyl)-s-triazine, 2-(3-chlorophenyl)-4,6-bis (trichloromethyl)-s-triazine, 2-(2-chlorophenyl)-4,6-bis (trichloromethyl)-s-triazine, 2-(4-methoxyphenyl)-4,6-bis (trichloromethyl)-s-triazine, 2-(3-methoxyphenyl)-4,6-bis (trichloromethyl)-s-triazine, 2-(2-methoxyphenyl)-4,6-bis (trichloromethyl)-s-triazine, 2-(4-methylthiophenyl)-4,6-bis (trichloromethyl)-s-triazine, 2-(3-methylthiophenyl)-4,6-bis (trichloromethyl)-s-triazine, 2-(2-methylthiophenyl)-4,6-bis (trichloromethyl)-s-triazine, 2-(4-methoxynaphthyl)-4,6-bis (trichloromethyl)-s-triazine, 2-(3-methoxynaphthyl)-4,6-bis (trichloromethyl)-s-triazine, 2-(2-methoxynaphthyl)-4,6-bis (trichloromethyl)-s-triazine, 2-(4-methoxy-β-styryl)-4,6-bis (trichloromethyl)-s-triazine, 2-(3-methoxy-β-styryl)-4,6-bis (trichloromethyl)-s-triazine, 2-(2-methoxy-β-styryl)-4,6-bis (trichloromethyl)-s-triazine, 2-(3,4,5-trimethoxy-β-styryl)-4,6-bis(trichloromethyl)-s-triazine, 2-(4-methylthio-p-styryl)-4,6-bis(trichloromethyl)-s-triazine, 2-(3-methylthio-β-styryl)-4,6-bis(trichloromethyl)-s-triazine, 2-(3-methylthio-β-styryl)-4,6-bis(trichloromethyl)-s-triazine, 2-piperonyl-4,6-bis(trichloromethyl)-s-triazine, 2-[2-(furan-2-yl)ethenyl]-4,6-bis(trichloromethyl)-s-triazine, 2-[2-(5-methylfuran-2-yl)ethenyl]-4,6-bis (trichloromethyl)-s-triazine and 2-[2-(4-diethylamino-2-methylphenyl)ethenyl]-4,6-bis (trichloromethyl)-s-triazine.

Examples of the above diaryl iodonium salt include diphenyliodonium tetrafluoroborate, diphenyliodonium hexafluorophosphonate, diphenyliodonium hexafluoroarsenate, diphenyliodonium trifluoromethanesulfonato, diphenyliodonium trifluorbacetate, diphenyliodonium-p-toluenesulfonato, diphenyliodonium butyltris(2,6-difluorophenyl)borate, diphenyliodonium hexyltris(p-chlorophenyl)borate, diphenyliodonium hexyltris (3-trifluoromethylphenyl) borate, 4-methxoyphenylphenyliodonium tetrafluoroborate, 4-methoxyphenylphenyliodonium hexafluorophosphonate, 4-methoxyphenylphenyliodonium hexafluoroarsenate, 4-methoxyphenylphenyliodonium trifluoromethanesulfonato, 4-methoxyphenylphenyliodonium trifluoroacetate, 4-methoxyphenylphenyliodonium-p-toluenesulfonato, 4-methoxyphenylphenyliodonium butyltris(2,6-difluorophenyl)borate, 4-methoxyphenylphenyliodonium hexyltris(p-chlorophenyl)borate, 4-methoxyphenylphenyliodonium hexyltris(3-trifluoromethylphenyl)borate, bis(4-tert-butylphenyl) iodonium tetrafluoroborate, bis(4-tert-butylphenyl) iodonium hexafluoroarsenate, bis(4-tert-butylphenyl) iodonium trifluoromethanesulfonato, bis(4-tert-butylphenyl) iodonium trifluoroacetate, bis(4-tert-butylphenyl)iodonium-p-toluenesulfonato, bis(4-tert-butylphenyl)iodonium butyltris(2,6-difluorophenyl)borate, bis(4-tert-butylphenyl) iodonium hexyltris(p-chlorophenyl)borate, bis(4-tert-butylphenyl)iodonium hexyltris(3-trifluoromethylphenyl) borate, phenyl 4-(2'-hydroxy-1'-tetradecaoxy) phenyliodonium tetrafluoroborate, phenyl 4-(2'-hydroxy-1'-tetradecaoxy)phenyliodonium trifluoromethanesulfonate, phenyl 4-(2'-hydroxy-1'-tetradecaoxy)phenyliodonium hexafluoroantimonato and phenyl 4-(2'-hydroxy-1'-tetradecaoxy)phenyliodonium hexafluoroantimonato.

Examples of the above triaryl sulfonium salt include triphenylsulfonium tetrafluoroborate, triphenylsulfonium hexafluorophosphonate, triphenylsulfonium hexafluoroarsenate, triphenylsulfonium trifluoromethanesulfonato, triphenylsulfonium trifluoroacetate, triphenylsulfonium-p-toluenesulfonato, triphenylsulfonium butyltris(2,6-difluorophenyl)borate, triphenylsulfonium hexyltris(p-chlorophenyl)borate, triphenylsulfonium hexyltris(3-trifluoromethylphenyl)borate, 4-methoxyphenyldiphenylsulfonium tetrafluoroborate, 4-methoxyphenyldiphenylsulfonium hexafluorophosphonate, 4-methoxyphenyldiphenylsulfonium hexafluoroarsenate, 4-methoxyphenyldiphenylsulfonium trifluoromethanesulfonato, 4-methoxyphenyldiphenylsulfonium trifluoroacetate, 4-methoxyphenyldiphenylsulfonium-p-toluenesulfonato, 4-methoxyphenyldiphenylsulfonium butyltris(2,6-difluorophenyl)borate, 4-methoxyphenyldiphenylsulfonium hexyltris(p-chlorophenyl)borate, 4-methoxyphenyldiphenylsulfonium hexyltris(3-trifluoromethylphenyl)borate, 4-phenylthiophenyldiphenylsulfonium tetrafluoroborate, 4-phenylthiophenyldiphenylsulfonium hexafluorophosphonate, 4-phenylthiophenyldiphenylsulfonium hexafluoroarsenate, 4-phenylthiophenyldiphenylsulfonium trifluoromethanesulfonato, 4-phenylthiophenyldiphenylsulfonium trifluoroacetate, 4-phenylthiophenyldiphenylsulfonium-p-toluenesulfonato, 4-phenylthiophenyldiphenylsulfonium butyltris(2,6-difluorophenyl)borate, 4-phenylthiophenyldiphenylsulfonium hexyltris(p-chlorophenyl)borate, 4-phenylthiophenyldiphenylsulfonium hexyltris(3-trifluoromethylphenyl)borate, 4-hydroxy-1-naphthalenyl dimethylsulfonium tetrafluoroborate, 4-hydroxy-1-naphthalenyl dimethylsulfonium hexafluorophosphonate, 4-hydroxy-1-naphthalenyl dimethylsulfonium hexafluoroarsenate, 4-hydroxy-1-naphthalenyl dimethylsulfonium trifluoromethanesulfonato, 4-hydroxy-1-naphthalenyl dimethylsulfonium trifluoroacetate, 4-hydroxy-1-naphthalenyl)dimethylsulfonium-p-toluenesulfonato, 4-hydroxy-1-naphthalenyl dimethylsulfonium butyltris(2,6-difluorophenyl)borate, 4-hydroxy-1-naphthalenyl dimethylsulfonium hexyltris(p-chlorophenyl)borate and 4-hydroxy-1-naphthalenyl dimethylsulfonium hexyltris(3-trifluoromethylphenyl)borate.

Examples of the above quaternary ammonium salt include tetramethylammonium tetrafluoroborate, tetramethylammonium hexafluorophosphonate, tetramethylammonium hexafluoroarsenate, tetramethylammonium trifluoromethanesulfonato, tetramethylammonium trifluoroacetate, tetramethylammonium-p-toluenesulfonato, tetramethylammonium butyltris(2,6-difluorophenyl)borate, tetramethylammonium hexyltris(p-chlorophenyl)borate, tetramethylammonium hexyltris(3-trifluoromethylphenyl)borate, tetrabutylammonium tetrafluoroborate, tetrabutylammonium hexafluorophosphonate, tetrabutylammonium hexafluoroarsenate, tetrabutylammonium trifluoromethanesulfonato, tetrabutylammonium trifluoroacetate, tetrabutylammonium-p-toluenesulfonato, tetrabutylammonium butyltris(2,6-difluorophenyl)borate, tetrabutylammonium hexyltris(p-chlorophenyl)borate, tetrabutylammonium hexyltris(3-trifluoromethylphenyl)borate, benzyltrimethylammonium tetrafluoroborate, benzyltrimethylammonium hexafluorophosphonate, benzyltrimethylammonium hexafluoroarsenate, benzyltrimethylammonium trifluoromethanesulfonato, benzyltrimethylammonium trifluoroacetate, benzyltrimethylammonium-p-toluenesulfonato, benzyltrimethylammonium butyltris(2,6-difluorophenyl)borate, benzyltrimethylammonium hexyltris(p-chlorophenyl)borate, benzyltrimethylammonium hexyltris(3-trifluoromethylphenyl)borate, benzyldimethylphenylammonium tetrafluoroborate, benzyldimethylphenylammonium hexafluorophosphonate, benzyldimethylphenylammonium hexafluoroarsenate, benzyldimethylphenylammonium trifluoromethanesulfonato, benzyldimethylphenylammonium trifluoroacetate, benzyldimethylphenylammonium-p-toluenesulfonato, benzyldimethylphenylammonium butyltris(2,6-difluorophenyl)borate, benzyldimethylphenylammonium hexyltris(p-chlorophenyl)borate, benzyldimethylphenylammonium hexyltris(3-trifluoromethylphenyl)borate, N-cinnamylideneethylphenylammonium tetrafluoroborate, N-cinnamylideneethylphenylammonium hexafluorophosphonate, N-cinnamylideneethylphenylammonium hexafluoroarsenate, N-cinnamylideneethylphenylammonium trifluoromethanesulfonato, N-cinnamylideneethylphenylammonium trifluoroacetate, N-cinnamylideneethylphenylammonium-p-toluenesulfonato, N-cinnamylideneethylphenylammonium butyltris(2,6-difluorophenyl)borate, N-cinnamylideneethylphenylammonium hexyltris(p-chlorophenyl)borate and N-cinnamylideneethylphenylammonium hexyltris(3-trifluoromethylphenyl)borate.

Examples of the above sulfonic acid ester include α-hydroxymethylbenzoin-p-toluenesulfonic acid ester, α-hydroxymethylbenzoin-trifluoromethanesulfonic acid ester, α-hydroxymethylbenzoin-methanesulfonic acid ester, pyrogallol-tri(p-toluenesulfonic acid)ester, pyrogallol-tri(trifluoromethanesulfonic acid)ester, pyrogallol-trimethanesulfonic acid ester, 2,4-dinitrobenzyl-p-toluenesulfonic acid ester, 2,4-dinitrobenzyl-trifluoromethanesulfonic acid ester, 2,4-dinitrobenzyl-methanesulfonic acid ester, 2,4-dinitrobenzyl-1,2-naphthoquinonediazido-5-sulfonic acid ester, 2,6-dinitrobenzyl-p-toluenesulfonic acid ester, 2,6-dinitrobenzyl-trifluoromethanesulfonic acid ester, 2,6-dinitrobenzyl-methanesulfonic acid ester, 2,6-dinitrobenzyl-1,2-naphthoquinonediazido-5-sulfonic acid ester, 2-nitrobenzyl-p-toluenesulfonic acid ester, 2-nitrobenzyl-trifluoromethanesulfonic acid ester, 2-nitrobenzyl-methanesulfonic acid ester, 2-nitrobenzyl-1,2-naphthoquinonediazido-5-sulfonic acid ester, 4-nitrobenzyl-p-toluenesulfonic acid ester, 4-nitrobenzyl-trifluoromethanesulfonic acid ester, 4-nitrobenzyl-methanesulfonic acid ester, 4-nitrobenzyl-1,2-naphthoquinonediazido-5-sulfonic acid ester, N-hydroxynaphthalimido-p-toluenesulfonic acid ester, N-hydroxynaphthalimido-trifluoromethanesulfonic acid ester, N-hydroxynaphthalimido-methanesulfonic acid ester, N-hydroxy-5-norbornene-2,3-dicarboxyimido-p-toluenesulfonic acid ester, N-hydroxy-5-norbornene-2,3-dicarboxyimido-trifluoromethanesulfonic acid ester, N-hydroxy-5-norbornene-2,3-dicarboxyimido-methanesulfonic acid ester, 2,4,6,3',4',5'-hexahydroxybenzophenone-1,2-naphthoquinonediazido-4-sulfonic acid ester and 1,1,1-tri(p-hydroxyphenyl)ethane-1,2-naphthoquinonediazido-4-sulfonic acid ester.

Out of these compounds, 2-(3-chlorophenyl)-bis(4,6-trichloromethyl)-s-triazine, 2-(4-methoxyphenyl)-bis(4,6-trichloromethyl)-s-triazine, 2-(4-methylthiophenyl)-bis(4,6-trichloromethyl)-s-triazine, 2-(4-methoxy-β-styryl)-bis(4,6-trichloromethyl)-s-triazine, 2-piperonyl-bis(4,6-trichloromethyl)-s-triazine, 2-[2-(furan-2-yl)ethenyl]-bis.(4,6-trichloromethyl)-s-triazine, 2-[2-(5-methylfuran-2-yl)ethenyl]-bis(4,6-trichloromethyl)-s-triazine, 2-[2-(4-diethylamino-2-methylphenyl)ethenyl]-bis(4,6-trichloromethyl)-s-triazine and 2-(4-methoxynaphthyl)-bis(4,6-trichloromethyl)-s-triazine are preferred as trichloromethyl-s-triazines; diphenyliodonium trifluoroacetate, diphenyliodonium trifluoromethanesulfonato, 4-methoxyphenylphenyliodonium trifluoromethanesulfonato, 4-methoxyphenylphenyliodonium trifluoroacetate, phenyl 4-(2'-hydroxy-1'-tetradecaoxy)phenyliodonium trifluoromethanesulfonato, phenyl 4-(2'-hydroxy-1'-tetradecaoxy)phenyliodonium hexafluoroantimonato and phenyl 4-(2'-hydroxy-1'-tetradecaoxy)phenyliodonium-p-toluenesulfonato are preferred as diaryliodonium salts; triphenylsulfonium trifluoromethanesulfonato, triphenylsulfonium trifluoroacetate, 4-methoxyphenyldiphenylsulfonium trifluoromethanesulfonato, 4-methoxyphenyldiphenylsulfonium trifluoroacetate, 4-phenylthiophenyldiphenylsulfonium trifluoromethanesulfonato and 4-phenylthiophenyldiphenylsulfonium trifluoroacetate are preferred as triarylsulfonium salts; tetramethylammonium butyltris(2,6-difluorophenyl)borate, tetramethylammonium hexyltris(p-chlorophenyl)borate, tetramethylammonium hexyltris(3-trifluoromethylphenyl) borate, benzyldimethylphenylammonium butyltris(2,6-difluorophenyl)borate, benzyldimethylphenylammonium hexyltris(p-chlorophenyl)borate and benzyldimethylphenylammonium hexyltris(3-trifluoromethylphenyl)borate are preferred as quaternary ammonium salts; and 2,6-dinitrobenzyl-p-toluenesulfonic acid ester, 2,6-dinitrobenzyl-trifluoromethanesulfonic acid ester, N-hydroxynaphthalimido-p-toluenesulfonic acid ester and N-hydroxynaphthalimido-trifluoromethanesulfonic acid ester are preferred as sulfonic acid esters.

The above radiation sensitive base generator is a compound which can generate a basic substance capable of curing (crosslinking) the component (A1) upon exposure to radiation such as ultraviolet radiation.

Radiation sensitive base generators disclosed by JP-A 4-330444, "Polymer", pp. 242–248, vol. 46, No. 6 (1997) and U.S. Pat. No. 5,627,010 are advantageously used. However, any radiation sensitive base generator is acceptable if it generates a base upon exposure to radiation as function.

Examples of the radiation sensitive base generator (A2) which can be preferably used in the present invention include compounds represented by the following formulas (2) to (12):

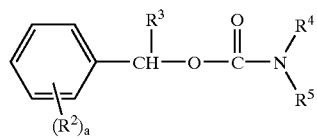
(2)

wherein $R^2$ is an alkyl group having 1 to 6 carbon atoms, alkoxyl group having 1 to 6 carbon atoms, thioalkyl group having 1 to 6 carbon atoms, dialkylamino group having two alkyl groups with 1 to 6 carbon atoms, piperidyl group, nitro group, hydroxy group, mercapto group, alkenyl group or alkynyl group having 2 to 6 carbon atoms, aryl group having 6 to 20 carbon atoms, fluorine atom, chlorine atom or bromine atom, a is an integer of 0 to 5, $R^3$ is a hydrogen atom, alkyl group having 1 to 6 carbon atoms, alkenyl group or alkynyl group having 2 to 6 carbon atoms, or aryl group having 6 to 20 carbon atoms, and $R^4$ and $R^5$ are each independently a hydrogen atom, alkyl group having 1 to 6 carbon atoms, alkenyl group or alkynyl group having 2 to 6 carbon atoms, or aryl group or benzyl group having 6 to 20 carbon atoms, or $R^4$ and $R^5$ may be bonded together to form a cyclic structure having 5 to 6 carbon atoms with a nitrogen atom bonded thereto,

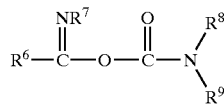
(3)

wherein $R^6$ is an alkyl group having 1 to 6 carbon atoms, alkoxyl group having 1 to 6 carbon atoms, thioalkyl group having 1 to 6 carbon atoms, dialkylamino group having two alkyl groups with 1 to 6 carbon atoms, piperidyl group, nitro group, hydroxy group, mercapto group, alkenyl group or alkynyl group having 2 to 6 carbon atoms, or aryl group having 6 to 20 carbon atoms, $R^7$ is a hydrogen atom, alkyl group having 1 to 6 carbon atoms, alkenyl group or alkynyl group having 2 to 6 carbon atoms, or aryl group having 6 to 20 carbon atoms, and $R^8$ and $R^9$ are each independently a hydrogen atom, alkyl group having 1 to 6 carbon atoms, alkenyl group or alkynyl group having 2 to 6 carbon atoms, or aryl group or benzyl group having 6 to 20 carbon atoms, or $R^8$ and $R^9$ may be bonded together to form a cyclic structure having 5 to 6 carbon atoms with a nitrogen atom bonded thereto,

(4)

wherein $R^{10}$ is an alkyl group having 1 to 6 carbon atoms, alkenyl group or alkynyl group having 2 to 6 carbon atoms, or aryl group having 6 to 20 carbon atoms, and $R^{11}$ and $R^{12}$ are each independently a hydrogen atom, alkyl group having 1 to 6 carbon atoms, alkenyl group or alkynyl group having 2 to 6 carbon atoms, or aryl group or benzyl group having 6 to 20 carbon atoms, or $R^{11}$ and $R^{12}$ may be bonded together to form a cyclic structure having 5 to 6 carbon atoms with a nitrogen atom bonded thereto,

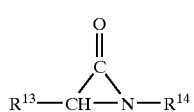
(5)

wherein $R^{13}$ and $R^{14}$ are each independently an alkyl group having 1 to 6 carbon atoms, alkenyl group or alkynyl group having 2 to 6 carbon atoms, or aryl group having 6 to 20 carbon atoms,

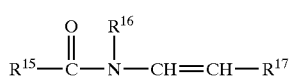
(6)

wherein $R^{15}$, $R^{16}$ and $R^{17}$ are each independently an alkyl group having 1 to 6 carbon atoms, alkenyl group or alkynyl group having 2 to 6 carbon atoms, or aryl group having 6 to 20 carbon atoms,

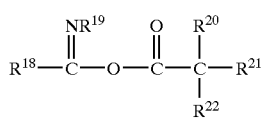
(7)

wherein $R^{18}$ is an alkyl group having 1 to 6 carbon atoms, alkoxyl group having 1 to 6 carbon atoms, thioalkyl group having 1 to 6 carbon atoms, dialkylamino group having two alkyl groups with 1 to 6 carbon atoms, piperidyl group, nitro group, hydroxy group, mercapto group, alkenyl group or alkynyl group having 2 to 6 carbon atoms, or aryl group having 6 to 20 carbon atoms, $R^{19}$ is a hydrogen atom, alkyl group having 1 to 6 carbon atoms, alkenyl group or alkynyl group having 2 to 6 carbon atoms, or aryl group having 6 to 20 carbon atoms, and $R^{20}$, $R^{21}$ and $R^{22}$ are each independently a hydrogen atom, alkyl group having 1 to 6 carbon atoms, alkenyl group or alkynyl group having 2 to 6 carbon atoms, or aryl group or benzyl group having 6 to 20 carbon atoms,

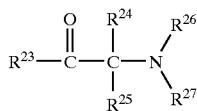

(8)

wherein $R^{23}$ is an alkyl group having 1 to 6 carbon atoms, alkoxyl group having 1 to 6 carbon atoms, thioalkyl group having 1 to 6 carbon atoms, dialkylamino group having two alkyl groups with 1 to 6 carbon atoms, piperidyl group, nitro group, hydroxy group, mercapto group, alkenyl group or alkynyl group having 2 to 6 carbon atoms, or aryl group having 6 to 20 carbon atoms, $R^{24}$ and $R^{25}$ are each independently a hydrogen atom, hydroxyl group, mercapto group, cyano group, phenoxy group, alkyl group having 1 to 6 carbon atoms, fluorine atom, chlorine atom, bromine atom, alkenyl group or alkynyl group having 2 to 6 carbon atoms, or aryl group having 6 to 20 carbon atoms, and $R^{26}$ and $R^{27}$ are each independently a hydrogen atom, alkyl group having 1 to 6 carbon atoms, alkenyl group or alkynyl group having 2 to 6 carbon atoms, or aryl group or benzyl group having 6 to 20 carbon atoms, or $R^{26}$ and R27 may be bonded together to form a cyclic structure having 5 to 6 carbon atoms with a nitrogen atom bonded thereto,

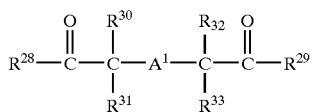

(9)

wherein $R^{28}$ and $R^{29}$ are each independently an alkyl group having 1 to 6 carbon atoms, alkoxyl group having 1 to 6 carbon atoms, thioalkyl group having 1 to 6 carbon atoms, dialkylamino group having two alkyl groups with 1 to 6 carbon atoms, piperidyl group, nitro group, hydroxy group, mercapto group, alkenyl group or alkynyl group having 2 to 6 carbon atoms, or aryl group having 6 to 20 carbon atoms, $R^{30}$ to $R^{33}$ are each independently a hydrogen atom, hydroxyl group, mercapto group, cyano group, phenoxy group, alkyl group having 1 to 6 carbon atoms, fluorine atom, chlorine atom, bromine atom, alkenyl group or alkynyl group having 2 to 6 carbon atoms, or aryl group having 6 to 20 carbon atoms, and $A^1$ is a divalent atomic group formed by excluding two hydrogen atoms bonded to one or two nitrogen atoms of a monoalkylamine, piperazine, aromatic diamine or aliphatic diamine,

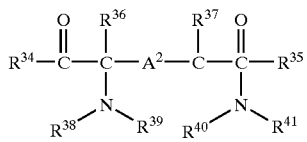

(10)

wherein $R^{34}$ and $R^{35}$ are each independently an alkyl group having 1 to 6 carbon atoms, alkoxyl group having 1 to 6 carbon atoms, thioalkyl group having 1 to 6 carbon atoms, dialkylamino group having two alkyl groups with 1 to 6 carbon atoms, piperidyl group, nitro group, hydroxy group, mercapto group, alkenyl group or alkynyl group having 2 to 6 carbon atoms, or aryl group having 6 to 20 carbon atoms, $R^{36}$ and $R^{37}$ are each independently a hydrogen atom, hydroxyl group, mercapto group, cyano group, phenoxy group, alkyl group having 1 to 6 carbon atoms, fluorine atom, chlorine atom, bromine atom, alkenyl group or alkynyl group having 2 to 6 carbon atoms, or aryl group having 6 to 20 carbon atoms, $R^{38}$ to $R^{41}$ are each independently a hydrogen atom, alkyl group having 1 to 6 carbon atoms, alkenyl group or alkynyl group having 2 to 6 carbon atoms, or aryl group or benzyl group having 6 to 20 carbon atoms, or $R^{38}$ and $R^{39}$, or $R^{40}$ and $R^{41}$ may be bonded together to form a cyclic structure having 5 to 6 carbon atoms with a nitrogen atom bonded thereto, and $A^2$ is an alkylene group having 1 to 6 carbon atoms, cyclohexylene group, phenylene group or single bond,

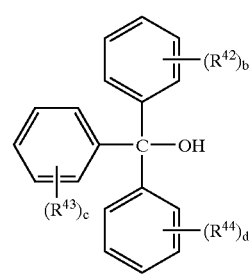

(11)

wherein $R^{42}$ to $R^{44}$ are each independently a hydrogen atom, fluorine atom, chlorine atom, bromine atom, alkyl group having 1 to 6 carbon atoms, alkoxyl group having 1 to 6 carbon atoms, alkenyl group or alkynyl group having 2 to 6 carbon atoms, or aryl group having 6 to 20 carbon atoms, and b, c and d are each independently an integer of 0 to 5,

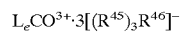

(12)

wherein L is at least one ligand selected from the group consisting of ammonia, pyridine, imidazole, ethylenediamine, trimethylenediamine, tetramethylenediamine, hexamethylenediamine, propylenediamine, 1,2-cyclohexanediamine, N,N-diethylethylenediamine and diethylenetriamine, e is an integer of 2 to 6, $R^{45}$ is an alkenyl group or alkynyl group having 2 to 6 carbon atoms, or aryl group having 6 to 20 carbon atoms, and $R^{46}$ is an alkyl group having 1 to 18 carbon atoms.

In all the above formulas (2) to (12), the alkyl group can be linear, branched or cyclic. Examples of the alkenyl group include vinyl group and propylenyl group, and examples of the alkynyl group include acetylenyl group. Examples of the aryl group include phenyl group, naphthyl group and anthracenyl group.

Also what are obtained by substituting a hydrogen atom contained in the above groups by a fluorine atom, chlorine atom, bromine atom, haloalkyl group, hydroxyl group, carboxyl group, mercapto group, cyano group, nitro group, azido group, dialkylamino group, alkoxyl group or thioalkyl group are included in the above examples.

Out of these radiation sensitive base generators, preferred are 2-nitrobenzylcyclohexyl carbamate, triphenyl methanol, o-carbamoylhydroxylamide, o-carbamoyloxime, [[(2,6-dinitrobenzyl)oxy]carbonyl]cyclohexylamine, bis[[(2-nitrobenzyl)oxy]carbonyl]hexane-1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl)pyrrolidine, hexaamminecobalt(III) tris(triphenylmethylborate) and 2-benzyl-2-dimethylamino-1-(4-morpholinophenyl)-butanone.

The amount of the component (A2) in the present invention is preferably 0.1 to 15 parts by weight, more preferably 1 to 10 parts by weight based on 100 parts by weight of the component (A1). When the amount of the component (A2) is within the above range, a composition having excellent radiation sensitivity is obtained. An insulating film obtained from the composition has excellent alkali resistance, solvent resistance and heat resistance.

Other Additives

The radiation sensitive composition for forming an insulating film for an organic EL display device of the present invention comprises the above components (A1) and (A2) as essential ingredients and may contain other additives as required.

The other additives include a silane coupling agent, dehydrating agent, acid diffusion control agent, sensitizer, surfactant, shelf stabilizer and antifoaming agent.

Silane Coupling Agent

The above silane coupling agent may be used to improve adhesion between an insulating film formed from the radiation sensitive composition of the present invention and a substrate.

The silane coupling agent is preferably a functional silane coupling agent, for example, a silane coupling agent having a reactive substituent such as a carboxyl group, methacryloyl group, vinyl group, isocyanate group, epoxy group or amino group. Examples of the silane coupling agent include trimethoxysilylbenzoic acid, methyldimethoxysilylbenzoic acid, γ-methacryloxypropyltrimethoxysilane, γ-methacryloxypropylmethyldimethoxysilane, γ-methacryloxyethyltrimethoxysilane, γ-methacryloxyethylmethyldimethoxysilane, vinyltriacetoxysilane, vinyltrimethoxysilane, vinylmethyldimethoxysilane, vinyltriethoxysilane, vinylmethyldiethoxysilane, γ-isocyanatopropyltrimethoxysilane, γ-isocyanatopropylmethyldimethoxysilane, γ-isocyanatoethyltrimethoxysilane, γ-isocyanatoethylmethyldimethoxysilane, γ-glycidoxypropyltrimethoxysilane, γ-glycidoxypropylmethyldimethoxysilane, β-glycidoxyethyltrimethoxysilane, β-glycidoxyethylmethyldimethoxysilane, β-(3,4-epoxycyclohexyl)ethyltrimethoxysilane, β-(3,4-epoxycyclohexyl)ethylmethyldimethoxysilane, γ-(3,4-epoxycyclohexyl)propyltrimethoxysilane, γ-(3,4-epoxycyclohexyl)propylmethyldimethoxysilane, N-(2-aminoethyl)-3-aminopropyltrimethoxysilane, N-(2-aminoethyl)-3-aminopropylmethyldimethoxysilane, 3-aminopropyltriethoxysilane and 3-aminopropylmethyldiethoxysilane.

Commercially available products of the silane coupling agent include Sila-Ace S210, S220, S310, S320, S330, S510, S520, S530 and S710 (of Chisso Corporation), A-151, A-171, A-172, A-174, Y-9936, A-186, A-187, A-1100, A-1110, A-1120, A-1122, Y-9669 and A-1160 (of Nippon Unicar Co., Ltd.), and SH6020, SZ6023, SH6026, SZ6030, SZ6032, SH6040, SZ6050, SZ6070, SZ6072, SZ6075, SZ6083 and SZ6300 (of Toray Dow Corning Silicone Co., Ltd.).

Out of these, silane coupling agents having an epoxy group are preferred, and γ-glycidoxypropyltrimethoxysilane, γ-glycidoxypropylmethyldimethoxysilane, β-glycidoxyethyltrimethoxysilane, β-glycidoxyethylmethyldimethoxysilane, β-(3,4-epoxycyclohexyl)ethyltrimethoxysilane, β-(3,4-epoxycyclohexyl)ethylmethyldimethoxysilane, γ-(3,4-epoxycyclohexyl)propyltrimethoxysilane and γ-(3,4-epoxycyclohexyl)propylmethyldimethoxysilane are particularly preferred.

The amount of the silane coupling agent is preferably 50 parts or less by weight, more preferably 2 to 50 parts by weight, much more preferably 5 to 30 parts by weight based on 100 parts by weight of the component (A1).

Dehydrating Agent

The dehydrating agent which can be added to the radiation sensitive composition of the present invention can convert water into another substance through a chemical reaction or can trap water by physical adsorption or inclusion. By containing the dehydrating agent in the radiation sensitive composition of the present invention, the influence of water coming from environment or water generated from the component (A1) upon exposure to radiation in the step of forming an insulating film which will be described hereinafter can be reduced. Therefore, it is assumed that the dehydrating agent contributes to the improvement of the radiation sensitivity of the composition.

At least one compound selected from the group consisting of a carboxylic acid ester, acetal (including ketal) and carboxylic anhydride is preferably used as the dehydrating agent.

The above carboxylic acid ester is preferably an orthocarboxylic acid ester or carboxylic acid silyl ester.

Examples of the orthocarboxylic acid ester include methyl orthoformate, ethyl orthoformate, propyl orthoformate, butyl orthoformate, methyl orthoacetate, ethyl orthoacetate, propyl orthoacetate, butyl orthoacetate, methyl orthopropionate and ethyl orthopropionate. Out of these orthocarboxylic acid esters, orthoformic acid esters are particularly preferred.

Examples of the carboxylic acid silyl ester include trimethylsilyl acetate, tributylsilyl acetate, trimethylsilyl formate and trimethylsilyl oxalate.

Examples of the acetal include reaction products between a ketone and an alcohol, reaction products between a ketone and a dialcohol, and ketene silyl acetals. Example of the reaction products between a ketone and an alcohol include dimethyl acetal, diethyl acetal and dipropyl acetal.

Examples of the above carboxylic anhydride include formic anhydride, acetic anhydride, succinic anhydride, maleic anhydride, phthalic anhydride, benzoic anhydride and antic-benzoic anhydride. Out of these, acetic anhydride and succinic anhydride are preferred because they are particularly excellent in dehydrating effect.

The amount of the dehydrating agent used in the present invention is preferably 100 parts or less by weight, more preferably 0.1 to 100 parts by weight, much more preferably 0.5 to 50 parts by weight, particularly preferably 1 to 10 parts by weight based on 100 parts by weight of the component (A1).

Beyond the above range, the effect of the dehydrating agent is not further enhanced.

Acid Diffusion Control Agent

In the present invention, the acid diffusion control agent may be used when a compound which generates an acid upon exposure to radiation (radiation sensitive acid generator) is used as the component (A2). The agent controls the diffusion of an acidic substance generated by exposing the radiation sensitive acid generator to radiation in the coating film of the composition and suppresses a curing reaction in an unexposed area.

By adding such an acid diffusion control agent, a radiation sensitive composition having excellent pattern accuracy can be obtained.

Examples of the acid diffusion control agent include a compound (to be referred to as "nitrogen-containing compound (I)" hereinafter) represented by the following formula (13), diamino compound having two nitrogen atoms in the same molecule (to be referred to as "nitrogen-containing compound (II)" hereinafter), nitrogen-containing compound having three or more nitrogen atoms (to be referred to as "nitrogen-containing compound (III)" hereinafter), amido group-containing compound, urea compound and nitrogen-containing heterocyclic compound:

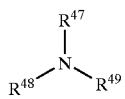
(13)

wherein $R^{47}$, $R^{48}$ and $R^{49}$ are each independently a hydrogen atom, alkyl group having 1 to 6 carbon atoms, aryl group having 6 to 12 carbon atoms or aralkyl group having 7 to 12 carbon atoms, and some or all of the hydrogen atoms of the above alkyl group, aryl group and aralkyl group may be substituted by a halogen atom.

The above nitrogen-containing compound (I) is, for example, a monoalkylamine, dialkylamine, trialkylamine, aromatic amine or alkanolamine.

Examples of the nitrogen-containing compound (I) include monoalkylamines such as n-hexylamine, n-heptylamine, n-octylamine, n-nonylamine and n-decylamine; dialkylamines such as di-n-butylamine, di-n-pentylamine, di-n-hexyalmine, di-n-heptylamine, di-n-octylamine, di-n-nonylamine and di-n-decylamine; trialkylamines such as triethyalmine, tri-n-propylamine, tri-n-butylamine, tri-n-pentylamine, tri-n-hexylamine, tri-n-heptylamine, tri-n-octylamine, tri-n-nonylamine and tri-n-decylamine; aromatic amines such as aniline, N-methylaniline, N,N-dimethylaniline, 2-methylaniline, 3-methylaniline 4-methylaniline, 4-nitroaniline, diphenylamine, triphenylamine, 1-naphthylamine; and alkanolamines such as ethanolamine, diethanolamine and triethanolamine.

Examples of the nitrogen-containing compound (II) include ethylenediamine, N,N,N',N'-tetramethylethylenediamine, tetramethylenediamine, hexamethylenediamine, N,N,N',N'-tetrakis(2-hydroxyethyl) ethylenediamine, N,N,N',N'-tetrakis(2-hydroxypropyl) ethylenediamine, 4,4'-diaminodiphenylmethane, 4,4'-diaminodiphenyl ether, 4,4'-diaminobenzophenone, 4,4'-dimainodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene and 1,3-bis[1-(4-aminophenyl)-1-methylethyl]benzene.

Examples of the nitrogen-containing compound (III) include polyethyleneimine, polyallylamine and dimethylaminoethyl acrylamide polymer.

Examples of the above amido group-containing compound include formamide, N-methylformamide, N,N-dimethylformamide, acetamide, N-methylacetamide, N,N-dimethylacetamide, propionamide, benzamide, pyrrolidone and N-methylpyrrolidone.

Examples of the above urea compound include urea, methylurea, 1,1-dimethylurea, 1,3-dimethylurea, 1,1,3,3-tetramethylurea, 1,3-diphenylurea and tributylthiourea.

The above nitrogen-containing heterocyclic compound is, for example, an imidazole, a pyridine or other nitrogen-containing heterocyclic compound.

Examples of the above imidazole include imidazole, benzimidazole, 2-methylimidazole, 4-methylimidazole, 2-phenylimidazole, 4-phenylimidazole and 4-methyl-2-phenylimidazole. Examples of the pyridine include pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinic acid amide, quinoline, 8-oxyquinoline and acridine.

Examples of the other nitrogen-containing heterocyclic compound include pyrazine, pyrazole, pyridazine, quinoxaline, purine, pyrrolidine, piperidine, morpholine, 4-methylmorpholine, piperazine, 1,4-dimethylpiperazine and 1,4-diazabicyclo[2.2.2]octane.

Out of these acid diffusion control agents, nitrogen-containing compounds (I) and nitrogen-containing heterocyclic compounds are preferred. Out of these, trialkylamines are particularly preferred as the nitrogen-containing compounds (I) and pyridines are particularly preferred as the nitrogen-containing heterocyclic compounds.

Particularly preferred are triethylamine, tri-n-propylamine, tri-n-butylamine, tri-n-pentylamine, tri-n-hexylamine, tri-n-heptylamine, tri-n-octylamine, pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinic acid amide, quinoline, 8-oxyquinoline and acridine.

These acid diffusion control agents may be used alone or in combination of two or more.

The amount of the acid diffusion control agent is preferably 15 parts or less by weight, more preferably 0.001 to 15 parts by weight, much more preferably 0.005 to 5 parts by weight based on 100 parts by weight of the component (A1).

Sensitizer

The sensitizer can be blended to improve the radiation sensitivity of the radiation sensitive composition of the present invention. Examples of the sensitizer include 2-H-pyrido-(3,2-b)-1,4-oxazin-3(4H)-ones, 10H-pyrido-(3,2-b)-(1,4)-benzothiazines, urazoles, hydantoins, barbituric acids, glycine anhydrides, 1-hydroxybenzotriazoles, alloxans, maleimides, coumarines having a substituent at the 3-position and/or 7-position, flavones, dibenzalacetones, dibenzalcyclohexanes, chalcones, xanthenes, thioxanthens, porphyrins, phthalocyanines, acridines and anthracenes.

The amount of the sensitizer is preferably 100 parts or less by weight, more preferably 1 to 50 parts by weight based on 100 parts by weight of the component (A2).

Surfactant

The surfactant may be added to improve coatability, for example, prevent striation and improve the developability of an exposed portion after the formation of a dry coating film.

Examples of the surfactant include nonionic surfactants such as polyoxyethylene alkyl ethers including polyoxyethylene lauryl ether, polyoxyethylene stearyl ether and polyoxyethylene oleyl ether; polyoxyethylene aryl ethers including polyoxyethylene octylphenyl ether and polyoxyethylene nonylphenyl ether; and polyethylene glycol dialkyl esters including polyethylene glycol dilaurate and polyethylene glycol distearate; fluorine-based surfactants which are commercially available under the trade names of F Top EF301, EF303 and EF352 (of Shin Akita Kasei Co., Ltd.), Megafac F171, F172 and F173 (of Dainippon Ink and Chemicals, Inc.), Florade FC430 and FC431 (of Sumitomo 3M Limited), and Asahi Guard AG710, Surflon S-382, SC-101, SC-102, SC-103, SC-104, SC-105 and SC-106 (of Asahi Glass Co., Ltd.); silicone-based additives commercially available under the trade names of SH200-100cs, SH28PA, SH30PA, ST89PA and SH190 (of Toray Dow Corning Silicone Co., Ltd.); and other surfactants which are commercially available under the trade names of KP341 organosiloxane polymer (of Shin-Etsu Chemical Co., Ltd.) and Polyflow No. 57 and No. 95 acrylic or methacrylic acid-based (co)polymers (of Kyoeisha Chemical Co., Ltd.).

The amount of the surfactant is preferably 2 parts or less by weight, more preferably 1 part or less by weight based on 100 parts by weight of the components (A1).

Other additives which may be contained in the radiation sensitive composition for forming an insulating film for a liquid crystal display device of the present invention as required include an acid diffusion control agent, dehydrating agent, sensitizer, surfactant, adhesion aid, shelf stabilizer and antifoaming agent. Out of these, the acid diffusion control agent, dehydrating agent, sensitizer and surfactant are identical to those used in the radiation sensitive composition for forming an insulating film for an organic EL display device and used in the same amounts. It should be understood that the amounts are identical to those of the components (A1) and the components (A2).

Radiation Sensitive Composition for Forming an Insulating Film for Display Devices The radiation sensitive composition of the present invention comprises the components (A1) and (A2) and other additives which are optionally added. It is generally dissolved or dispersed in a solvent before use.

The solvent which can be used to prepare the radiation sensitive composition of the present invention preferably dissolves or disperses the components of the radiation sensitive composition of the present invention uniformly and does not react with these components.

The solvent is, for example, an alcohol, ether, glycol ether, ethylene glycol alkyl ether acetate, diethylene glycol alkyl ether, propylene glycol monoalkyl ether, propylene glycol alkyl ether acetate, propylene glycol alkyl ether propionate, aromatic hydrocarbon, ketone or ester.

Examples of the solvent include alcohols such as methanol and ethanol; ethers such as tetrahydrofuran; glycol ethers such as ethylene glycol monomethyl ether and ethylene glycol monoethyl ether; ethylene glycol alkyl ether acetates such as methyl cellosolve acetate and ethyl cellosolve acetate; diethylene glycol alkyl ethers such as diethylene glycol monomethyl ether, diethylene glycol monoethyl ether, diethylene glycol dimethyl ether, diethylene glycol diethyl ether and diethylene glycol ethyl methyl ether; propylene glycol monoalkyl ethers such as propylene glycol methyl ether, propylene glycol ethyl ether, propylene glycol propyl ether and propylene glycol butyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether propionates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, methyl isobutyl ketone, cyclohexanone, 2-heptanone and 4-hydroxy-4-methyl-2-pentanone; and esters such as methyl acetate, ethyl acetate, propyl acetate, isopropyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate and butyl 3-butoxypropionate.

Out of these solvents, glycol ethers, ethylene glycol alkyl ether acetates, propylene glycol monoalkyl ethers, propylene glycol alkyl ether acetates, ketones, esters and diethylene glycol alkyl ethers are preferred from the viewpoints of solubility, dispersibility, unreactivity with the above components and ease of forming a coating film. Particularly preferred are ethylene glycol monomethyl ether, ethylene glycol monoethyl ether, diethylene glycol monomethyl ether, diethylene glycol monoethyl ether, diethylene glycol diethyl ether, diethylene glycol ethyl methyl ether, methyl cellosolve acetate, ethyl cellosolve acetate, propylene glycol methyl ether, propylene glycol ethyl ether, propylene glycol methyl ether acetate, propylene glycol ethyl ether acetate, cyclohexanone, propyl acetate, isopropyl acetate, butyl acetate, ethyl 2-hydroxypropionate, methyl 2-hydroxy-2-methylpropionate, ethyl 2-hydroxy-2-methylpropionate, methyl lactate, ethyl lactate, propyl lactate, butyl lactate, methyl 2-methoxypropionate and ethyl 2-methoxypropionate.

These solvents may be used alone or in combination.

Further, a high-boiling solvent may be used in combination with the above solvent. Examples of the high-boiling solvent include benzyl ethyl ether, dihexyl ether, diethylene glycol monomethyl ether, diethylene glycol monoethyl ether, diethylene glycol monobutyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate and carbitol acetate.

The amount of the high-boiling solvent is preferably 50 wt % or less based on the total of all the solvents.

The radiation sensitive composition of the present invention is prepared using the above solvent. A suitable solid content is selected according to application purpose but it can be 5 to 50 wt %.

The composition solution prepared as described above is filtered with a filter having an opening diameter of about 0.2 μm before use.

Method of Forming an Insulating Film for Display Devices

An insulating film for an organic EL display device or a liquid crystal display device can be formed from the radiation sensitive composition of the present invention as follows.

The radiation sensitive composition of the present invention is applied to the surface of a base substrate and prebaked to remove the solvent so as to form a coating film. The coating technique may be spraying, roll coating, rotational coating or bar coating.

The prebaking condition which differs according to the type of each component and the ratio of the components is preferably 30 to 200° C., more preferably 40 to 150° C., and a hot plate or oven, or infrared radiation may be used for heating.

The film thickness after prebaking can be adjusted to a desired value by the solid content and application conditions of the radiation sensitive composition. It can be about 0.5 to 7 μm for an organic EL display device and about 0.25 to 4 μm for a liquid crystal display device.

The thus formed coating film is then exposed to radiation through a predetermined pattern mask. The radiation used for exposure is ultraviolet rays such as g-line (wavelength of 436 nm) or i-line (wavelength of 365 nm), deep ultraviolet rays such as a KrF excimer laser beam, X-rays such as synchrotron radiation, and charged corpuscular beam such as electron beam. Out of these, g-line and i-line are preferred. The amount of exposure is generally 50 to 10,000 $J/m^2$, preferably 100 to 5,000 $J/m^2$.

In the present invention, heating (to be referred to as "post-exposure baking (PEB)") is preferably carried out after exposure. A similar device to the above prebaking device may be used for PEB and PEB conditions may be arbitrary. The heating temperature is preferably 30 to 150° C., more preferably 30 to 130° C.

After exposure to radiation, the coating film is developed with a developer to remove an exposed portion so as to obtain a desired pattern. Preferred examples of the developer used herein include inorganic alkalis such as sodium hydroxide, potassium hydroxide, sodium carbonate, sodium silicate, sodium metasilicate and ammonia water; primary amines such as ethylamine and n-propylamine; secondary amines such as diethyalmine and di-n-propylamine; tertiary amines such as triethylamine and methyldiethylamine; alcohol amines such as dimethyl ethanolamine, triethanolamine; quaternary ammonium salts such as tetramethylammonium hydroxide, tetraethylammonium hydroxide and choline; and alkali aqueous solutions comprising a cyclic amine such as pyrrole, piperidine, 1,8-diazabicyclo-(5.4.0)-7-undecene or 1,5-diazabicyclo-(4.3.0)-5-nonane dissolved in water. A water-soluble organic solvent such as an alcohol exemplified by methanol and ethanol and a surfactant may be added to the developer in a suitable amount. Further, an organic solvent which dissolves the composition of the present invention may be used as the developer.

The development technique may be puddle development, dipping or shaking immersion.

After development, the patterned film may be rinsed with running water.

Thereafter, an insulating film for an organic EL display device or liquid crystal display device of interest can be formed by heating this film with a heater such as a hot plate or oven. This heating temperature may be 150 to 400° C., and the heating time is 5 to 30 minutes when heating is carried out on the hot plate and 30 to 90 minutes when heating is carried out in the oven.

The thickness of the insulating film can be adjusted to a suitable value based on the composition of the composition and the structure of an organic EL display device or liquid crystal display device of interest. It can be adjusted to 0.5 to 7 $\mu$m for an organic EL display device and 0.25 to 4 $\mu$m for a liquid crystal display device.

Since conventionally known insulating film materials are essentially composed of an organic synthetic polymer and have limitation to their heat resistances, the heating temperature in the above heating step cannot be increased to the full. Therefore, heating at a temperature of 250° C. or lower has to be carried out, thereby making it impossible to remove water contained in the materials completely in the heating step. When the materials are used in the insulating film of an organic EL display device, water remaining in the insulating film permeates the organic EL layer to become one of the causes of impeding the light emission characteristics of the organic EL display device.

The radiation sensitive composition of the present invention can be heated at a temperature higher than 250° C., for example, 300 to 400° C. in the above heating step, whereby water remaining in the insulating film can be removed completely. Therefore, it is considered that the radiation sensitive composition of the present invention contributes to the extension of the service life of the organic EL display device.

The thus formed insulating film of the present invention has high heat resistance, high transparency and excellent solvent resistance. When it is used as an interlayer insulating film for a liquid crystal display device and heated at 300° C., it can retain sufficiently high transparency. Even when it is heated at 320° C., it can still retain sufficiently high transparency. An interlayer insulating film formed from a composition containing a phenolic resin such as a novolak resin and a quinonediazide-based sensitizer or a composition containing an acrylic resin and a quinonediazide-based sensitizer has a heat resistance of up to about 230° C. When it is heated at a temperature higher than 230° C., it becomes yellow or brown, thereby greatly reducing its transparency.

Production of Organic EL Display Device

The organic EL display device of the present invention has the insulating film formed as described above.

The organic EL display device of the present invention is produced as follows, for example.

A drive terminal is formed on a substrate such as a glass substrate and the insulating film of the present invention is formed on the drive terminal as described above. A transparent electrode (hole injection electrode) such as an ITO electrode is deposited by sputtering and its pattern is formed by a wet etching method.

Moreover, a hole transport layer, organic EL layer, electron transport layer and electron injection electrode are deposited on the above substrate in order. The hole transport layer is made from a phthalocyanine material such as CuPc or $H_2Pc$, or an aromatic amine. The organic EL medium is a base material such as $Alq_3$ or $BeB_3$ doped with quinacridone or coumarine. Further, the electron transport layer is made from $Alq_3$, for example, and the electron injection electrode is made from Mg—Al, Al—Li, Al—$Li_2O$ or Al-Lif.

Thereafter, a stainless steel can having a hollow structure and the above substrate are sealed up with a sealer such as an epoxy resin and assembled together into a module as an organic EL display device.

Liquid Crystal Display Device

The liquid crystal display device of the present invention has the above-described interlayer insulating film, provides high brightness to a screen and has excellent reliability.

EXAMPLES

The following examples are given to further illustrate the present invention. However, the present invention is not limited by these examples. The molecular weight described hereinbelow is weigh average molecular weight in terms of polystyrene measured by the HLC-8020 GPC chromatograph of Toso Co., Ltd.

Synthesis Example 1

Preparation Example 1 of Component (A1)

300.0 g of methyltrimethoxysilane, 47.5 g of ion exchange water having an electric conductivity of $8 \times 10^{-5}$ S·cm$^{-1}$ and 0.1 g of oxalic acid were placed in a vessel equipped with a stirrer and heated at 60° C. for 6 hours under agitation to hydrolyze methyltrimethoxysilane.

Thereafter, 1,000 g of propylene glycol monomethyl ether was added to this vessel, and ion exchange water and methanol by-produced by hydrolysis were removed by an evaporator.

The final solid content of the solution was adjusted to 25 wt % to obtain a propylene glycol monomethyl ether solution containing the component (A1). This is designated as solution (a-1).

The weight average molecular weight of the prepared component (A1) was 8,000.

Synthesis Example 2

Preparation Example 2 of Component (A1)

In this synthesis. 150.0 g of methyltrimethoxysilane, 150.0 g of butyltrimethoxysilane, 50.0 g of ion exchange water, having an electric conductivity of $8 \times 10^{-5}$ S·cm$^{-1}$ and 0.05 g of oxalic acid were placed in a vessel equipped with a stirrer, and heated at 60° C. for 6 hours under agitation, to hydrolyze methyltrimethoxysilane and butyltrimethoxysilane.

Thereafter, 1,000 g of propylene glycol monomethyl ether was added to this vessel, and ion exchange water and methanol by-produced by hydrolysis were removed by an evaporator.

The final solid content of the solution was adjusted to 25 wt % to obtain a propylene glycol monomethyl ether solution containing the component (A1). This is designated as solution (a-2).

The weight average molecular weight of the prepared component (A1) was 6,000.

Example 1

400 parts by weight of the above solution (a-1) as the component (A1) (corresponding to 100 parts by weight of the component (A1)) and 2.0 parts by weight of phenyl 4-(2'-hydroxy-1'-tetradecaoxy)phenyliodonium-o-toluenesulfonato as the component (A2) which is a radiation sensitive composition were uniformly mixed and dissolved together, and the obtained solution was filtered with a membrane filter having an opening diameter of 0.2 μm to obtain a composition solution.

Formation of a Thin Film Pattern (Insulating Film)

The above prepared composition solution was applied to a glass substrate by spin coating to a thickness of 1.2 μm and prebaked on a hot plate at 100° C. for 3.0 minutes to form a coating film. This coating film was exposed to 3,000 J/m$^2$ of radiation using the NSR1755i7A reduction projection stepper (NA=0.50, λ=365 nm) of Nikon Corporation through a predetermined mask and post-exposure baked on a hot plate at 90° C. for 3.0 minutes. Subsequently, the formed coating film was developed with a 2.38 wt % aqueous solution of tetramethylammonium hydroxide at 25° C. for 1.5 minutes in accordance with a rocking immersion method, rinsed in pure running water and dried to form a pattern on the substrate. Thereafter, the pattern was heated in an oven at 350° C. for 60 minutes to form a matrix-like pattern (insulating film) having a thickness of 1.0 μm and a line width of 10 μm.

(1) Generation of Scum (Observation Through an Electron Microscope)

The pattern obtained above was observed through the S-4200 electron microscope (of Hitachi High-Technologies Corporation). The generation of scum is shown in Table 1.

(2) Evaluation of Alkali Resistance

The glass substrate having the above pattern formed thereon was immersed in a 1% NaOH aqueous solution maintained at a temperature of 25° C. for 20 minutes. When the thickness of the film before immersion was represented by T1 and the thickness of the film after immersion was represented by t1, the thickness ratio (t1/T1)×100 (%) was calculated. The results are shown in Table 1. When this value is 95 to 105%, it can be said that alkali resistance is satisfactory.

(3) Evaluation of Solvent Resistance

The glass substrate having the above pattern formed thereon was immersed in a mixed solution of dimethyl sulfoxide and N-methylpyrrolidone (weight ratio of 70/30) maintained at a temperature of 25° C. for 20 minutes. When the thickness of the film before immersion was represented by T2 and the thickness of the film after immersion was represented by t2, the thickness ratio (t2/T2)×100 (%) was calculated. The results are shown in Table 1. When this value is 95 to 105%, it can be said that solvent resistance is satisfactory.

(4) Evaluation of Heat Resistance

The thin film pattern on the glass substrate having this pattern was scraped off by a spatula. 0.5 g of the thin film pieces was heated from room temperature to 320° C. at a temperature elevating rate of 10° C./min using the TGA-2950 thermogravimetric analyzer (of TA Instruments Co., Ltd.) and maintained at 320° C. for 30 minutes to measure a reduction in weight after heating. When this weight reduction is 3% or less of the weight before heating, it can be said that heat resistance is satisfactory.

(5) Evaluation of Planarization

The above composition was applied to a silicon wafer substrate having a 1 μm-thick aluminum pattern with a line width of 20 μm and a space interval of 80 μm to a thickness of 1.2 μm by spin coating. Thereafter, the coating film was prebaked at 120° C. for 3.0 minutes and further heated at 350° C. for 60 minutes to produce a substrate having a thin film for the evaluation of planarization.

The unevenness of the surface of this substrate having a thin film was measured using an a-step (of KLA-Tencor Co., Ltd.). The maximum height difference is shown in Table 1. When this value is 0.2 μm or less, it can be said that flattening capability is satisfactory.

(6) Evaluation of Resolution

A thin film for the evaluation of resolution was formed in the same manner as the above "formation of thin film pattern (insulating film)" except that a pattern mask having a 5.0×5.0 μm square hole was used as a pattern mask in the exposure step. This thin film was observed through the S-4200 electron microscope to see whether the 5.0×5.0 μm square hole was accurately formed. When the 5.0×5.0 μm square hole is accurately formed, it can be said that resolution is satisfactory.

(7) Half-life of Brightness

An organic EL panel for evaluation was manufactured to carry out a lighting promoting test at a screen brightness of 100 cd/m$^2$ {(Red: 100+Green: 200+Blue: 100)cd/m$^2$÷3× 0.7≈100 cd/m$^2$} and a temperature of 105° C. The time elapsed before the brightness of the screen was halved is shown in Table 1. When this value is 400 hours or more, it can be said that the half-life of brightness is satisfactory.

(8) Evaluation of Adhesion

The composition solution prepared above was applied to a glass substrate having an ITO film (300 mm×300 mm square, thickness of 1.1 mm, resistance of 10 Ω) manufactured by Giomatic Co., Ltd. to a thickness of 1.2 μm by spin coating and prebaked on a hot plate at 100° C. for 3.0 minutes to form a coating film. This coating film was entirely exposed to 3,000 J/m$^2$ of ultraviolet radiation with a ghi mixed line using the PLA501F aligner of Canon Corporation and post-exposure baked on a hot plate at 100° C. for 3.0 minutes. Thereafter, the exposed film was developed with a 2.38 wt % aqueous solution of tetramethylammonium hydroxide at 25° C. for 1.5 minutes by the rocking immersion method, rinsed in pure running water and dried to form a pattern on the substrate. The substrate was heated in an oven at 350° C. for 60 minutes to form a 1.0 μm-thick cured film.

The adhesion of this cured film was measured by a 8.5.3 cross-cut adhesion test in accordance with JIS K-5400-1990. The number of the remaining squares out of 100 squares is shown in Table 1.

(9) Evaluation of Transparency

Three different patterns were formed on the respective Corning 1737 glass substrates (of Corning Co., Ltd.) in the same manner as the above "formation of pattern (interlayer insulating film)" except the post-exposure baking temperature was changed to 220° C., 260° C. and 300° C., respectively. The light transmissions of the glass substrates having a cured film were measured by the 150-20 Double Beam spectrophotometer of Hitachi, Ltd. at a wavelength of 400 to 800 nm. The minimum light transmittances are shown in Table 1. When this value is 95% or more, transparency is excellent, when this value is 80% or more and less than 95%, transparency is satisfactory and when this value is less than 80%, transparency is unsatisfactory.

Example 2

400 parts by weight of the above-described solution (a-2) (corresponding to 100 parts by weight of the component (A1)) as the component (A1), 1.0 part by weight of triphenylsulfonium trifluoromethanesulfonato which is a radiation sensitive acid generator as the component (A2), 0.5 part by weight of 9-hydroxymethylanthracene as a sensitizer, 0.02 part by weight of triethylamine as an acid diffusion control agent, 3.0 parts by weight of methyl orthoformate as a dehydrating agent and 0.05 part by weight of SH28PA (of Toray Dow Corning Silicone Co., Ltd.) as a silicone-based surfactant were uniformly mixed and dissolved together, and the resulting solution was filtered with a membrane filter having an opening diameter of 0.2 μm to obtain a composition solution.

This composition solution was evaluated in the same manner as in Example 1 except that the amount of exposure in the step of exposure to radiation was changed as shown in Table 1. The results are shown in Table 1.

Example 3

400 parts by weight of the above-described solution (a-2) (corresponding to 100 parts by weight of the component (A1)) as the component (A1) and 6.0 parts by weight of N-(2-nitrobenzyloxycarbonyl)pyrrolidine as the component (A2) which is a radiation sensitive base generator were added, uniformly mixed and dissolved together, and the resulting solution was filtered with a membrane filter having an opening diameter of 0.2 μm to obtain a composition solution.

This composition solution was evaluated in the same manner as in Example 1 except that the amount of exposure in the step of exposure to radiation was changed as in Table 1. The results are shown in Table 1.

Example 4

400 parts by weight of the above-described solution (a-2) (corresponding to 100 parts by weight of the component (A1)) as the component (A1), 1.0 part by weight of triphenylsulfonium trifluoromethanesulfonato as the component (A2) which is a radiation sensitive acid generator, 0.5 part by weight of 9-hydroxymethylanthracene as a sensitizer, 15 parts by weight of β-(3,4-epoxycyclohexyl)ethyltrimethoxysilane (Silaace S530 of Chisso Corporation) which is a silane coupling agent and 0.05 part by weight of the SH28PA silicone-based surfactant (of Toray Dow Corning Silicone Co., Ltd.) were uniformly mixed and dissolved together, and the resulting solution was filtered with a membrane filter having an opening diameter of 0.2 μm to obtain a composition solution.

This composition solution was evaluated in the same manner as in Example 1 except that the amount of exposure in the step of exposure to radiation was changed as shown in Table 1. The results are shown in Table 1.

Example 5

The transparency (minimum light transmittance) of the pattern obtained in Example 1 was measured. The result is shown in Table 2. Some results in Table 1 are also shown in Table 2.

The transparency was evaluated in the same manner as (9) in Example 1.

Example 6

400 parts by weight of the above-described solution (a-2) (corresponding to 100 parts by weight of the component (A1)) as the component (A1), 1.0 part by weight of triphenylsulfonium trifluoromethanesulfonato as the component (A2) which is a radiation sensitive acid generator, 0.5 part by weight of 9-hydroxymethylanthracene as a sensitizer, 0.02 part by weight of triethylamine as an acid diffusion control agent and 0.05 part by weight of the SH28PA silicone-based surfactant (of Toray Dow Corning Silicone Co., Ltd.) were uniformly mixed and dissolved together, and the resulting solution was filtered with a membrane filter having an opening diameter of 0.2 μm to obtain a composition solution.

This composition solution was evaluated in the same manner as in Example 5 except that the amount of exposure in the step of exposure to radiation was changed as shown in Table 2. The results are shown in Table 2.

Example 7

A composition solution of Example 3 was prepared and evaluated in the same manner as in Example 5 except that the amount of exposure in the step of exposure to radiation was changed as in Table 2 and post-exposure baking was carried out at 130° C. for 3 minutes. The results are shown in Table 2.

Comparative Synthesis Example 1

5 parts by weight of 2,2'-azobis(2,4-dimethylvaleronitrile) and 200 parts by weight of diethylene glycol methyl ethyl ether were fed to a flask equipped with a cooling tube and a stirrer. Subsequently, 25 parts by weight of styrene, 20 parts by weight of methacrylic acid, 45 parts by weight of glycidyl methacrylate and 10 parts by weight of methacrylic acid [5.2.1.0$^{2,6}$]decane-8-yl (commonly called "dicyclopentanyl methacrylate" in this technical field) were fed to the flask, the inside of the flask was substituted by nitrogen, and agitation was started gently. The temperature of the solution was raised to 70° C. and maintained at that temperature for 5 hours to obtain a polymer solution. The solid content of the obtained polymer solution was 30.6 wt %. This is designated as solution (a-3).

The weight average molecular weight of the prepared polymer was 6,000.

Comparative Example 1

The solution (a-3) obtained in Comparative Synthesis Example 1 (corresponding to 100 parts by weight of the

TABLE 1

| | Amount of exposure (J/m$^2$) | generation of scum | alkali resistance | solvent resistance | heat resistance | flattening capability (μm) | 5.0 × 5.0 μm square hole | half-life of brightness (h) | adhesion (number) |
|---|---|---|---|---|---|---|---|---|---|
| Ex. 1 | 3,000 | Not seen | 101% | 102% | 0.5% | 0.18 | formed | 730 | 90 |
| Ex. 2 | 2,500 | Not seen | 102% | 102% | 0.6% | 0.19 | formed | 800 | 92 |
| Ex. 3 | 5,000 | Not seen | 101% | 101% | 0.4% | 0.17 | formed | 750 | 85 |
| Ex. 4 | 3,000 | Not seen | 101% | 101% | 0.7% | 0.18 | formed | 720 | 100 |

Ex. = Example polymer) and 30 parts by weight of a condensate of 4,4'-[1-[4-[1-[4-hydroxyphenyl]-1-methylethyl]phenyl] ethylidene]bisphenol (1 mol) and 1,2-naphthoquinone diazido-5-sulfonic acid ester (2 mols) were mixed together and dissolved in diethylene glycol ethyl methyl ether to a solid content of 30 wt %. The resulting solution was filtered with a membrane filter having an opening diameter of 0.2 μm to obtain a composition solution.

The above prepared composition solution was applied to a glass substrate to a film thickness of 1.2 μm by spin coating and prebaked on a hot plate at 90° C. for 2.0 minutes to form a coating film. After this coating film was exposed to radiation by the NSR1755i7A reduction projection stepper (NA=0.50, λ=365 nm) of Nikon Corporation through a predetermined pattern mask, it was developed with a 0.4 wt % aqueous solution of tetramethylammonium hydroxide at 25° C. for 1 minute by the rocking immersion method, rinsed in pure running water and dried to form a pattern on the wafer. Thereafter, the pattern was exposed to 3,000 J/m² of ultraviolet radiation with a ghi mixed line using the PLA501F aligner of Canon Corporation and heated (post-exposure baking) in an oven at 220° C. for 60 minutes to form a 1.0 μM-thick pattern (interlayer insulating film).

The pattern formed from the above composition was evaluated for (1) the generation of scum, (2) solvent resistance, (3) heat resistance, (4) transparency, (5) flattening capability and (6) resolution in the same manner as in the above Examples. The results are shown in Table 2.

TABLE 2

| | Amount of exposure (J/m²) | generation of scum | solvent resistance | heat resistance | minimum light transmittance | | | flattening capability (μm) | 5.0 × 5.0 μm square hole |
| --- | --- | --- | --- | --- | --- | --- | --- | --- | --- |
| | | | | | Post-exposure baking at 220° C. | Post-exposure baking at 260° C. | Post-exposure baking at 300° C. | | |
| Ex. 5 | 3,000 | Not seen | 102% | 0.5% | 97 | 96 | 96 | 0.18 | formed |
| Ex. 6 | 2,500 | Not seen | 102% | 0.6% | 98 | 96 | 95 | 0.19 | formed |
| Ex. 7 | 5,000 | Not seen | 101% | 0.4% | 96 | 96 | 95 | 0.17 | formed |
| C. Ex. 1 | 1,200 | Not seen | 103% | 12.5% | 95 | 85 | 60 | 0.16 | formed |

Ex. = Example
C. Ex. = Comparative Example

As described above, according to the present invention, there is provided a radiation sensitive composition for forming an insulating film for an organic EL display device, which has resolution high enough to form a through hole or U-shaped depression, excellent flattening capability and high resistance to a resist remover used to form a transparent electrode, and prevents the entry of impurities for impeding light emission.

The insulating film of the present invention formed from the above composition is suitable for use in an organic EL display device and the organic EL display device of the present invention having the insulating film has excellent reliability.

Also, the radiation sensitive composition of the present invention has high radiation sensitivity and excellent developability and is suitable for the formation of an interlayer insulating film for a liquid crystal display device. The interlayer insulating film of the present invention formed from the radiation sensitive composition of the present invention has high heat resistance, high transparency and excellent solvent resistance.

The liquid crystal display device of the present invention having the above interlayer insulating film of the present invention provides high brightness to a screen and has excellent reliability.

What is claimed is:

1. A radiation sensitive composition which comprises: component (A1), at least one compound selected from the group consisting of a silane compound represented by the following formula (1):

$$(R^1)_p Si(X)_{4-p} \qquad (1),$$

wherein $R^1$ is an unhydrolyzable organic group having 1 to 12 carbon atoms, X is a hydrolyzable group, and p is an integer of 0 to 3, a hydrolyzate thereof and a condensate of the hydrolyzate; and component (A2), a compound which generates an acid or base upon exposure to radiation; and component (B) which is used to form an insulating film for an organic EL display device.

2. The radiation sensitive composition of claim 1, which further comprises a silane coupling agent.

3. The radiation sensitive composition of claim 1, which further comprises a dehydrating agent.

4. A radiation sensitive composition which comprises: component (A1), at least one compound selected from the group consisting of a silane compound represented by the following formula (1):

$$(R^1)_p Si(X)_{4-p} \qquad (1),$$

wherein $R^1$ is an unhydrolyzable organic group having 1 to 12 carbon atoms, X is a hydrolyzable group, and p is an integer of 0 to 3, a hydrolyzate thereof and a condensate of the hydrolyzate; and component (A2), a compound which generates an acid or base upon exposure to radiation; and component (B) which is used to form an interlayer insulating film for a liquid crystal display device.

5. The radiation sensitive composition of claim 4, which further comprises a silane coupling agent.

6. An insulating film for an organic EL display device, formed from the radiation sensitive composition of claim 1.

7. An organic EL display device comprising the insulating film of claim 5.

8. An interlayer insulating film for a liquid crystal display device, formed from the radiation sensitive composition of claim 4.

9. A liquid crystal display device comprising the interlayer insulating film of claim 8.

10. The radiation sensitive composition of claim 2, which further comprises a dehydrating agent.

11. An insulating film for an organic EL display device, formed from the radiation sensitive composition of claim 2.

12. An insulating film for an organic EL display device, formed from the radiation sensitive composition of claim 3.

13. An interlayer insulating film for a liquid crystal display device, formed from the radiation sensitive composition of claim 5.

* * * * *